United States Patent [19]
Srivatsa et al.

[11] Patent Number: 6,009,253
[45] Date of Patent: *Dec. 28, 1999

[54] SPARE REPEATER AMPLIFIERS FOR LONG LINES ON COMPLEX INTEGRATED CIRCUITS

[75] Inventors: Chakra R. Srivatsa, San Jose; James A. Bauman, Palo Alto, both of Calif.

[73] Assignee: Sun Microsystems, Inc., Palo Alto, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/669,897

[22] Filed: Jun. 20, 1996

[51] Int. Cl.⁶ ................................................. G06F 17/50
[52] U.S. Cl. ............................... 395/500.07; 395/500.09; 395/500.13; 395/500.06
[58] Field of Search ................................. 364/488–491; 375/214; 455/16; 370/226, 227; 330/124 D; 385/46; 395/500.07, 500.09, 500.13, 500.06

[56] References Cited

U.S. PATENT DOCUMENTS

| | | | |
|---|---|---|---|
| 4,270,029 | 5/1981 | Sato et al. | 375/214 |
| 4,317,216 | 2/1982 | Kaegebein | 455/16 |
| 4,598,399 | 7/1986 | Bath | 370/226 |
| 4,698,760 | 10/1987 | Lembach et al. | 364/490 |
| 4,826,275 | 5/1989 | Heinzman | 385/46 |
| 4,930,118 | 5/1990 | Sugihara | 370/227 |
| 5,097,232 | 3/1992 | Stopper | 333/104 |
| 5,111,060 | 5/1992 | Asada | 307/219 |
| 5,235,221 | 8/1993 | Douglas et al. | 307/465 |
| 5,237,514 | 8/1993 | Curtin | 364/490 |
| 5,260,611 | 11/1993 | Cliff et al. | 307/465 |
| 5,287,289 | 2/1994 | Kageyama et al. | 364/489 |
| 5,333,032 | 7/1994 | Matsumoto et al. | 364/489 |
| 5,345,393 | 9/1994 | Ueda | 364/489 |
| 5,355,029 | 10/1994 | Houghton et al. | 307/443 |
| 5,359,535 | 10/1994 | Djaja et al. | 364/489 |
| 5,396,435 | 3/1995 | Ginetti | 364/489 |
| 5,402,357 | 3/1995 | Schaefer et al. | 364/490 |
| 5,404,311 | 4/1995 | Isoda | 364/490 |
| 5,416,718 | 5/1995 | Yamazaki | 364/488 |
| 5,418,490 | 5/1995 | Kaegebein | 330/124 D |
| 5,426,591 | 6/1995 | Ginetti et al. | 364/489 |
| 5,436,575 | 7/1995 | Pedersen et al. | 326/40 |
| 5,461,576 | 10/1995 | Tsay et al. | 364/490 |
| 5,475,605 | 12/1995 | Lin | 364/488 |
| 5,477,474 | 12/1995 | Southgate et al. | 364/578 |
| 5,661,661 | 8/1997 | Gregory et al. | 364/489 |

FOREIGN PATENT DOCUMENTS 4-1349922  9/1990  Japan ......................................... 15/60

OTHER PUBLICATIONS

Circuits, Interconnections, and Packaging for VLSI, H.B. Bakoglu, 1990, cover, copyright, and back pages, and pp. 112–115.

Bakoglu, "Circuits, Interconnections, and Packaging for VLSI," cover, copyright, and back pages, and pp. 112–115 (1990).

Tang et al. "Power Dissipation Models and Performance Improvement Techniques For CMOS Inverters With RC Line and Tree Interconnections," IEEE, pp. 437–443, Dec. 1993.

*Primary Examiner*—Kevin J. Teska
*Assistant Examiner*—Vuthe Siek
*Attorney, Agent, or Firm*—Forrest Gunnison

[57] ABSTRACT

An IC includes a plurality of functional blocks each having a discrete block-level architecture. The functional blocks are connected to one another via metal interconnect lines defined by an interconnect architecture. One or more of the functional blocks includes a spare (i.e., unused) repeater amplifier. Where a repeater amplifier inserted in a particular long line of the interconnect structure would decrease the signal propagation delay through the long line, the interconnect architecture is modified so that the long line is routed through the spare repeater amplifier. Such modification decreases the signal propagation delay of the long line without requiring a modification of the block-level architecture.

7 Claims, 1 Drawing Sheet

SPARE REPEATER AMPLIFIERS FOR LONG LINES ON COMPLEX INTEGRATED CIRCUITS

CROSS-REFERENCE TO A RELATED APPLICATION

The present Application is related to the commonly assigned, co-pending U.S. patent application Ser. No. 08/667,908 entitled "Method of Optimizing Repeater Placement in Long Lines of a Complex Integrated Circuit," by Chakra R. Srivatsa, filed herewith, which is incorporated by reference.

BACKGROUND

1. Field of the Invention

The present invention relates, in general, to the design of digital circuits, and more particularly to the reduction of delay times associated with relatively long lines in complex digital integrated circuits (ICs).

2. Description of Related Art

Modern very-large-scale integration (VLSI) techniques enable design engineers to combine many independent components, or functional blocks, on a single piece of silicon. Examples of typical functional blocks are floating point units, input buffers, and dynamic memories. Such blocks are combined to form e.g. a complete microprocessor as a single IC.

Complex ICs, such as those of the Sparc family of microprocessors available from Sun Microsystems of Mountain View, Calif., are typically designed by teams of design engineers, working in parallel, each team creating the architecture for one or more functional blocks. Once the block-level architectures are completed, another team of design engineers creates an interconnect architecture for interconnecting the various functional blocks. When the IC is manufactured, the interconnect architecture is realized using a high-level interconnect process, such as a conventional metalization process.

The speed performance of a complex IC is largely determined by the propagation delay time of electrical signals travelling through the relatively long conductors, or long lines, used to define various signal paths of the interconnect architecture. Consequently, individual functional blocks are arranged so that interconnect lines forming signal paths between the functional blocks are as short as possible. Nevertheless, the operation of routing interconnect lines for complex ICs typically results in a number of signal paths formed by relatively long lines. Some of these signal paths limit the overall speed performance of the resulting IC, and are therefore identified as critical paths.

To improve the speed performance of a given IC, design engineers must pay particular attention to reducing the signal propagation delay time of critical paths. It is commonly known that inserting one or more repeater amplifiers (i.e. "repeaters") into a long line can decrease the signal propagation delay time through that line. Thus, where a critical path is formed by a relatively long line, the signal propagation delay associated with that critical path can be advantageously decreased by rerouting the long line to include a repeater amplifier.

Unfortunately, because critical paths are typically identified while designing the interconnect architecture for the IC, design engineers cannot be sure which lines form critical paths until after the block-level architectures are completed; thus, inserting repeater amplifiers into a long line to decrease the delay time associated with a critical path can require architectural changes to one or more functional blocks of the IC. (For a detailed discussion of the use of repeater amplifiers for optimizing delay times through long lines, see the aforementioned application entitled "Method of Optimizing Repeater Placement In Long Lines Of A Complex Integrated Circuit.")

Changing a block-level architecture to include one or more repeater amplifiers requires several steps. First, the IC design process must return from interconnect-level design to block-level design so that the design engineers responsible for the architecture of the discrete functional blocks of the IC (i.e., block-level design engineers) can make the required changes. Second, the addition of a repeater amplifier within a functional block is not trivial; the new repeater amplifier and/or the associated connections affects the placement and operation of adjacent components, which in turn effect the placement and operation of other components. In short, block-level modification takes time, an especially valuable commodity in the rapidly evolving semiconductor industry. Consequently, there is a need for a more timely method of decreasing the signal propagation delay time of critical paths on an IC.

SUMMARY

The present invention allows a design engineer to decrease the signal propagation delay through a critical path on an IC without altering the architecture of functional blocks within the IC. According to the inventive method, engineers charged with block-level design incorporate into the block architectures a number of spare repeater amplifiers (repeaters) to be used later by engineers charged with interconnecting the various discrete functional blocks (i.e., interconnect-level design engineers). Each spare repeater amplifier of a given block includes input and output nodes that extend to the boundary of the block so that the spare repeaters may be readily connected, where needed, to subsequently routed interconnect lines.

Once the block architectures are complete, interconnect-level design engineers use commercially available software to identify critical paths defined by long lines between functional blocks on the IC. Then, where a repeater amplifier should be inserted in one of these long lines to decrease the signal propagation delay of a critical path, the interconnect architecture is modified so that the critical path is separated into a number of line segments using one or more of the spare repeater amplifiers. Because the repeater amplifiers are part of the block architecture, the only necessary change is to the interconnect architecture; accordingly, the requirement and expense of modifying block-level architectures are eliminated.

The concept of spare components is not new. For example, it is well known to provide spare logic gates within an individual function block to make it easier to modify the logic function performed by the block. However, such spare components are designed to affect changes in block-level architecture, and therefore do not include input and output nodes that extend to block boundaries. Moreover, prior spare components have not included spare repeater amplifiers to improve signal propagation speeds through interconnect lines.

DETAILED DESCRIPTION

According to the principles of this invention, one or more circuit blocks within an integrated circuit include one or more spare repeater amplifiers. As explained more completely below, the spare repeater amplifiers are used to optimize speed performance of relatively long signal paths between circuit blocks without requiring an alternative placement of any circuit block and without requiring a new layout for any circuit block. Consequently, the novel architecture of including spare repeater amplifiers reduces time-to-market without compromising performance.

Figure 1:
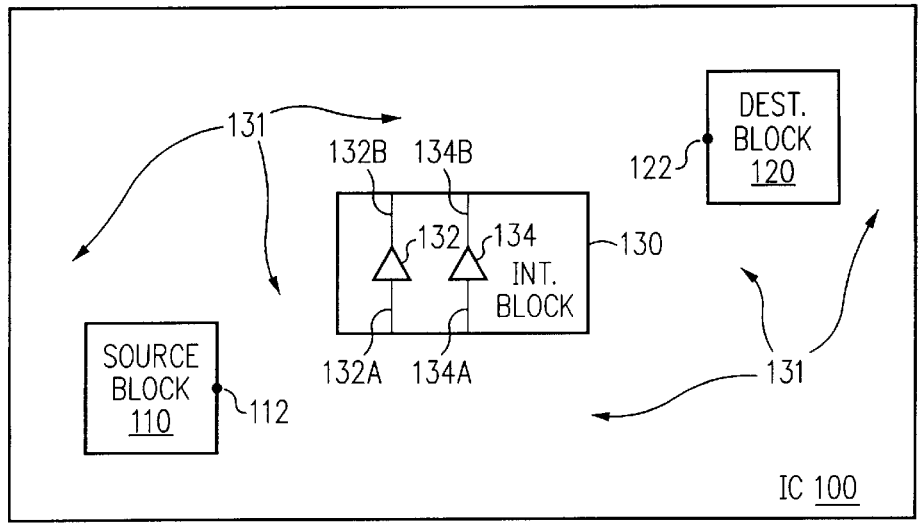
FIG. 1 is a block diagram of an IC 100 prior to a functional block interconnect process.

FIG. 1 is a block diagram of an IC 100, which includes a source block 110, a destination block 120, and an intermediate block 130. Each of functional blocks 110, 120, and 130 represents a discrete functional unit, or circuit, within IC 100. Examples of conventional functional blocks include floating point units, buffers, cache interfaces, and memory arrays.

The architectures of functional blocks 110, 120, and 130 are typically developed independently using a commercially available circuit modeling program. One such program, Verilog, is available from Cadence Design Systems, Inc., of San Jose, Calif. Once the individual block architectures are completed, an interconnect architecture is designed, again using a commercially available circuit modeling program such as Verilog, to connect functional blocks 110, 120, and 130 to one another and to input and output terminals (not shown) of IC 100. The graphical representations of FIGS. 1, 2, and 3 may be considered to represent physical circuit structures or Verilog simulations of circuit structures.

The borders defining functional blocks 110, 120, and 130 represent the physical boundaries of the block-level architectures of the respective functional blocks. These borders encompass those portions of IC 100 that have fixed architectures (i.e., block-level architectures) prior to the development of the high-level interconnect architecture. Input and output terminals of functional blocks 110, 120, and 130 (e.g., output terminal 112 of functional block 110 and input terminal 122 of functional block 120) extend to the borders of the respective blocks where the input and output terminals are accessible to interconnect routing channels 131 that occupy the areas surrounding and between functional blocks 110, 120, and 130.

In accordance with the present invention, intermediate block 130 includes, in addition to architectural features related to its primary function, spare repeater amplifiers 132 and 134. Each of repeater amplifiers 132 and 134 includes an input node (132A and 134A, respectively) and an output node (132B and 134B, respectively). Source block 110 and destination block 120 may include spare repeater amplifiers similar to those of intermediate block 130; however, such repeater amplifiers are omitted in this embodiment for simplicity.

It is known in the art to provide spare components, e.g. flip-flops and logic gates, within individual functional blocks to simplify the task of modifying block-level architectures. However, repeater amplifiers 132 and 134 are distinct from conventional spare components in that input nodes 132A and 134A and output nodes 132B and 134B are configured to connect directly to the interconnect architecture without modification of the block-level architecture of intermediate block 130. Thus configured, repeater amplifiers 132 and 134 do not effect the functionality of interconnect block 130; instead, input nodes 132A and 134A and output nodes 132B and 134B extend to the borders of intermediate block 130 where input nodes 132A and 134A and output nodes 132B and 134B are readily available to interconnect routing channels 131 surrounding functional block 130.

Because input nodes 132A and 134A and output nodes 132B and 134B are available to interconnect routing channels 131, input nodes 132A and 134A are easily connected to subsequently designed interconnect lines within interconnect routing channels 131. Thus, unlike conventional spare components, repeater amplifiers 132 and 134 do not simplify modification of block-level architectures, but instead eliminate the requirement of modifying block-level architectures in the event that interconnected functional blocks require one or more intervening repeater amplifiers.

Figure 2:
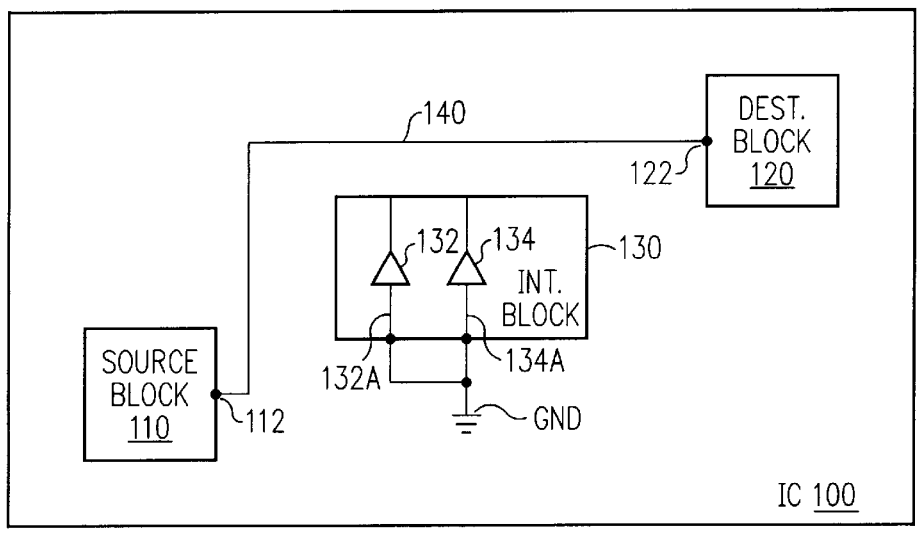
FIG. 2 is a block diagram of IC 100 after an interconnect process is performed.

FIG. 2 is a block diagram of IC 100, and includes a portion of an interconnect architecture. An output node 112 of source block 110 and an input node 122 of destination block 120 are shown connected via a long line 140 that provides a signal path from source block 110 to destination block 120. Input nodes 132A and 134A of spare repeater amplifiers 132 and 134, respectively, are shown connected to a ground plane GND. Ground plane GND ensures that unused repeater amplifiers 132 and 134 do not provide a DC current path due to a floating input node. Of course, input nodes 132A and 134A could be connected to other reference voltage sources, such as a Vcc terminal (not shown).

Long line 140 represents a conductor that, due to excessive length, limits the overall speed performance of IC 100. Consequently, the signal path associated with long line 140 is determined to be a critical path. Interconnect-level design engineers conventionally identify such critical paths using commercially available circuit analysis tools that employ e.g. the well-known Elmore delay method to calculate a delay period for each interconnect line of a simulated version of IC 100.

As explained above, inserting one or more repeater amplifiers into a long line can decrease the propagation delay time through that line. The above-cited application entitled "Method of Optimizing Repeater Placement in Long Lines of a Complex Integrated Circuit" teaches a novel approach for determining whether a particular long line will benefit from the addition of one or more repeater amplifiers. Other methods are also available for determining whether to insert a repeater amplifier into a long line. For more information pertaining to conventional methods for decreasing signal propagation times through long lines using repeater amplifiers, see H. B. Bakoglu, *Circuits, Interconnections, and Packaging for VLSI* 212–15 (Addison-Wesley Publishing Company, Inc. 1990).

In accordance with the present invention, if a signal propagation delay associated with a critical path can be decreased through the use of a repeater amplifier, an interconnect-level design engineer selects a spare repeater amplifier to insert in the long line. For example, the signal path defined by long line 140 may be rerouted to include one of spare repeater amplifiers 132 and 134 of intermediate block 130. Because there are generally many routing choices available, the design engineer may simulate a number of routing choices (i.e., a number of conductor/repeater combinations) to find the routing choice that produces the shortest signal propagation delay time.

Figure 3:
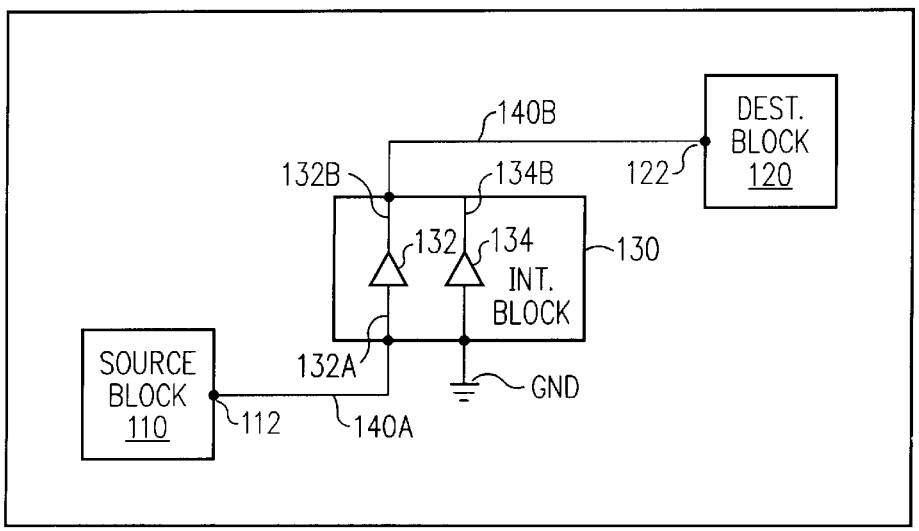
FIG. 3 is a block diagram of IC 100 in which a spare repeater amplifier is connected between a source block 110 and a destination block 120 so as to approximately bisect a long line 140 into lines 140A and 140B.

FIG. 3 is a block diagram of IC 100 in which spare repeater amplifier 132 is inserted into long line 140. In accordance with the present invention, the interconnect architecture is modified so that input node 132A is no longer connected to ground plane GND, but is instead connected to source block 110 via a line 140A. In addition, output node 132B is connected to destination block 120 via line 140B. Thus connected, repeater amplifier 132 approximately bisects long line 140.

Because input node 132A and output node 132B of repeater amplifier 132 extend to the border of intermediate block 130, re-routing long line 140 to include repeater amplifier 132 does not require any modification of the block-level architecture of IC 100 (e.g., the architectures of blocks 110, 120, or 130). Instead, only the interconnect-level architecture is changed. Thus, inserting repeater amplifiers in accordance with the present invention is accomplished without the time and expense of modifying block-level architectures.

The above description is illustrative and not limiting. Further modifications of the above-described invention will be apparent to those skilled in the art. For example, while the descriptions herein show repeater amplifiers as non-inverting amplifiers, the present invention is equally applicable to inverting amplifiers. Such variations fall within the scope of the appended claims.

What is claimed is:

1. An integrated circuit comprising:
   a first functional block-level architecture surrounded by a first border, and including at least one output node, the first border encompassing a block-level circuit architecture defining a function of the first functional block-level architecture;
   a second functional block-level architecture surrounded by a second border, the second border encompassing a block-level circuit architecture defining a function of the second functional block-level architecture and including a plurality of individual repeater amplifiers with each individual repeater amplifier having an input terminal and an output terminal;
      wherein the input terminal and the output terminal of each individual repeater amplifier in said plurality of repeater amplifiers each extend to the second border;
   a third functional block-level architecture having at least one input node;
   a first line connected between the at least one output node of the first functional block-level architecture and the at least one input terminal of one repeater amplifier in said plurality of repeater amplifiers; and
   a second line connected between the output terminal of the one repeater amplifier and the at least one input node of the third functional block-level architecture.

2. The circuit of claim 1, wherein the first and second lines are metal conductors.

3. The circuit of claim 1 further comprising a common voltage node, wherein said input terminal of each said individual repeater amplifier in said plurality of individual repeater amplifiers is connected to a common voltage.

4. The circuit of claim 3 wherein the common voltage node is a ground plane.

5. A method of optimizing a signal propagation delay period of a signal path on an integrated circuit, the signal path being defined between an output node of a first functional block-level architecture on the integrated circuit and an input node of a second functional block-level architecture on the integrated circuit, the integrated circuit further including a third functional block-level architecture, the method comprising:
   designing a circuit architecture for the third functional block-level architecture, the circuit architecture including a plurality of individual spare repeater amplifiers with each spare repeater amplifier having an input terminal and an output terminal;
   wherein the input terminal and the output terminal of each spare repeater amplifier in said plurality of individual spare repeater amplifiers extend to a border of said third functional block-level architecture;
   calculating a delay period associated with a first conductor connected between the output node of the first functional block-level architecture and the input node of the second functional block-level architecture;
   forming a second conductor connected between the output node of the first functional block-level architecture and the input terminal of one spare repeater amplifier of the third functional block-level architecture and forming a third conductor between the output terminal of the spare repeater amplifier and the input node of the second functional block-level architecture upon determining that use of the one spare repeater amplifier with said second and third conductors results in another delay period between said output node and said input node that is less than said delay period, wherein the first conductor is defined by an interconnect architecture, and further wherein the interconnect architecture is modified to define the second and third connector without modifying the circuit architecture for the third functional block-level architecture.

6. The method of claim 5, wherein the second and third conductors are formed using a metallization process.

7. The method of claim 5, wherein the delay period is calculated using circuit analysis tools on a simulated version of the integrated circuit.

* * * * *